(12) United States Patent
Chuang

(10) Patent No.: US 7,969,014 B2
(45) Date of Patent: Jun. 28, 2011

(54) POWER LAYOUT OF INTEGRATED CIRCUITS AND DESIGNING METHOD THEREOF

(75) Inventor: Chia-Lin Chuang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 191 days.

(21) Appl. No.: 12/129,390

(22) Filed: May 29, 2008

(65) Prior Publication Data
US 2009/0051040 A1    Feb. 26, 2009

(30) Foreign Application Priority Data

May 30, 2007    (TW) ............................... 96119271 A

(51) Int. Cl.
*H01L 23/48*    (2006.01)
*H01L 23/52*    (2006.01)
*H01L 29/40*    (2006.01)

(52) U.S. Cl. ............................... 257/776; 257/E23.011

(58) Field of Classification Search .................. 257/776, 257/E23.011
See application file for complete search history.

(56) References Cited

U.S. PATENT DOCUMENTS
5,789,807 A * 8/1998 Correale, Jr. .................. 257/691

FOREIGN PATENT DOCUMENTS
TW            594965        6/2004

OTHER PUBLICATIONS
English translation of abstract of TW594965.

* cited by examiner

*Primary Examiner* — Jenny L. Wagner
(74) *Attorney, Agent, or Firm* — Thomas, Kayden, Horstemeyer & Risley, LLP

(57) ABSTRACT

The invention discloses a technique for designing the power layout of an integrated circuit. The power layout design forms a power mesh and a power ring with a plurality of metal trunks with uniform line width. In particular, the power ring includes a plurality of metal rings, which are formed by arranging denser layout of the metal trunks with uniform line width. The power ring serves as a function of receiving and providing a power source to the elements of the integrated circuit.

8 Claims, 7 Drawing Sheets

POWER LAYOUT OF INTEGRATED CIRCUITS AND DESIGNING METHOD THEREOF

BACKGROUND OF THE INVENTION

1. Field of the Invention

The invention relates to a power layout design of an integrated circuit (IC), and more particularly, to a layout design of a power mesh and a power ring in an integrated circuit.

2. Description of the Prior Art

Please refer to FIG. 1A. FIG. 1A shows a simplified sectional view of a conventional IC die (or a chip) 1. As shown in FIG. 1A, the IC die 1 includes a semiconductor layer 10, six successive metal layers (121~126) from bottom to top, several insulating layers 14 formed between two adjacent metal layers respectively, and a passivation layer 16. The semiconductor layer 10 is used for forming electronic components such as transistors (not shown in FIG. 1A) and electrical routing among these electronic components. In order to achieve the minimal chip area and the fastest circuit rate, generally, only shorter electrical connections are formed on the semiconductor layer 10. The metal layers 121~126 are provided for other electrical connections. The number of the metal layers is determined by the complication of the practical routing. For example, eight or even more metal layers are widely used for IC design with complicated routing.

Regarding the routing at the metal layers 121~126, a power distribution network (not shown in FIG. 1A) can be formed at the first metal layer 121 and coupled to the electronic components. The power distribution network may be made of metal rails with finer line widths.

Please refer to FIG. 1B. FIG. 1B shows the higher metal layers of the IC die 1 and the routing formed thereon.

As shown in FIG. 1B, a power mesh 18 is formed at the sixth metal layer 126 and the fifth metal layer 125. The power mesh 18 includes metal trunks 182 and 184 with line widths wider than the metal rail. In addition, the metal trunks 182 and 184 formed at different metal layers 125 and 126 are interconnected by a via 142 formed at the insulating layer 14. In the same way, the power mesh 18 is connected to the power distribution network by the via 142. The metal trunks 182 and 184 are divided into a power metal trunk 182 for connecting power and a ground metal trunk 184 for connecting ground. At the same metal layer, the power metal trunk 182 and the ground metal trunk 184 are interlaced. The metal trunks 182 and 184 formed at the sixth metal layer 126 are perpendicular to those formed at the fifth metal layer 125. The metal trunks 182 formed at the sixth metal layer 126 are only connected to the metal trunks 182 formed at the fifth metal layer 125, and the metal trunks 184 formed at the sixth metal layer 126 are only connected to the metal trunks 184 formed at the fifth metal layer 125.

Please refer to FIG. 1B again. A power supply ring 17 (a small section of the power supply ring 17 is shown in FIG. 1B) can be formed at the sixth metal layer 126. In practical applications, the power supply ring 17 consists of two metal rings 172 and 174 with line widths larger than the metal trunk 182 and 184. The two metal rings 172 and 174 are divided into a power metal ring 172 for connecting power and a ground metal ring 174 for connecting ground. The metal rings 172 and 174 are formed at the sixth metal layer 126, and the metal rings 172 and 174 surround the metal trunks 182 and 184 which are also formed at the sixth metal layer 126 to form a ring structure (not shown in FIG. 1B). The power supply ring 17 is used for receiving a power and conducting the power to the power distribution network through the power mesh 18. The power distribution network is used for distributing the power to the electronic components.

When designing an IC, in order to provide well-planned power structures, it is necessary to collect a variety of specifications to match various requirements of the manufacturing process, the yield, and the occupied resource. Because a lot of details are requested, the power structures must be planned and accomplished by experienced layout engineers. As a result, a huge human resource burden is induced.

SUMMARY OF THE INVENTION

Therefore, a scope of the invention is to provide a power layout of an integrated circuit die (or a chip) and the designing method thereof. In the IC die, a power mesh and a power supply ring are integrated, and more particularly, the impedance difference between the power mesh and the power supply ring can be reduced. The routing congestion of the power mesh and the power supply ring can be effectively eased off.

A preferred embodiment according to the invention is an IC die. The IC die includes a semiconductor layer, a plurality of electronic components formed on the semiconductor layer, N successive metal layers from bottom to top, a power distribution network, a power mesh, and a power supply ring. Each of the N metal layers is isolated and formed over the semiconductor layer, wherein N is a positive integer. A power distribution network includes a plurality of metal rails and is coupled to the electronic components. The power mesh includes a plurality of metal trunks. The metal trunks are formed among the Nth metal layer to the ith metal layer. The metal trunks are interconnected by a plurality of first vias, and connected to the metal rails by a plurality of second vias, wherein i is a positive integer smaller than N. The power supply ring includes a plurality of metal rings. The metal rings are formed by parts of metal trunks that are densely concentrated. The power supply ring is used for receiving a power and conducting the power to the power distribution network through the power mesh. Then, the power distribution network distributes the power to the electronic components.

In another preferred embodiment according to the invention, the metal rings are also formed among the (N−1)th metal layer to the ith metal layer. The metal rings are also interconnected by a plurality of third vias.

The advantage and spirit of the invention may be understood by the following recitations together with the appended drawings.

BRIEF DESCRIPTION OF THE APPENDED DRAWINGS

FIG. 1A shows a simplified section view of a conventional IC die 1.

FIG. 1B shows the routing formed at metal layers 126 and 125 of the IC die 1.

FIG. 2A shows a simplified section view of an IC die 2 in a preferred embodiment according to the invention.

FIG. 2B shows the routing formed at metal layers 228 and 227 of the IC die 2.

DETAILED DESCRIPTION OF THE INVENTION

The characteristic, spirit, advantage, and convenience in practice of the invention can be particularly explained by the following preferred embodiments according to the invention.

Figure 1A:
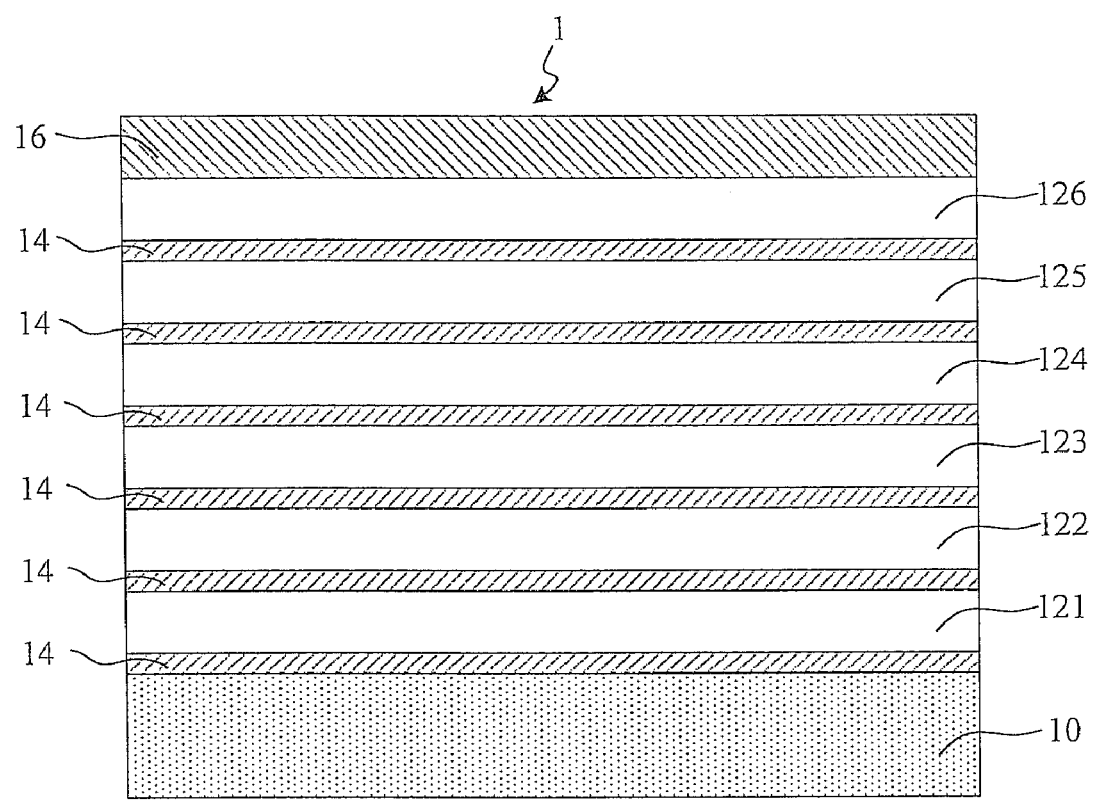
Figure 1B:
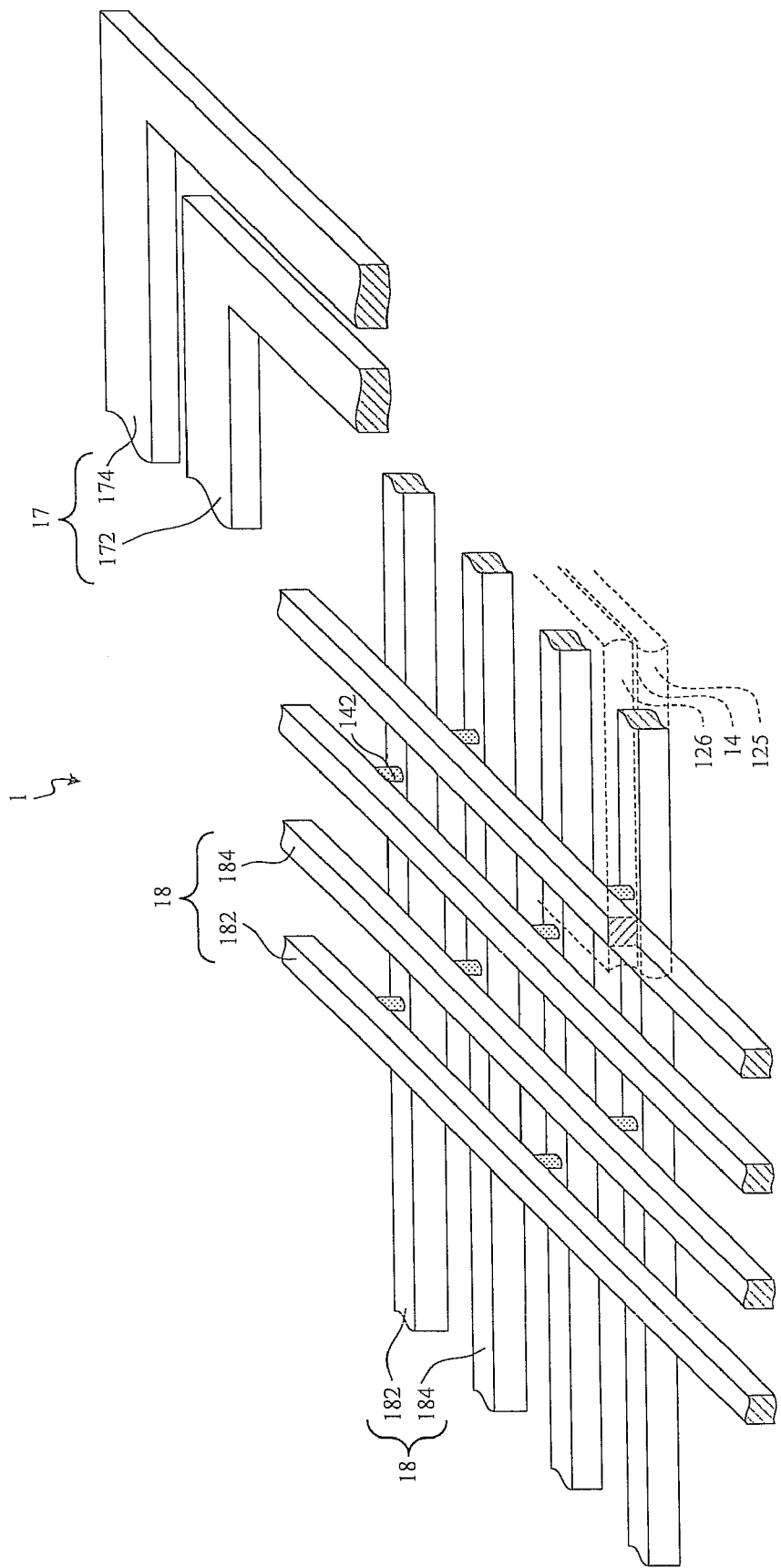
Figure 2A:
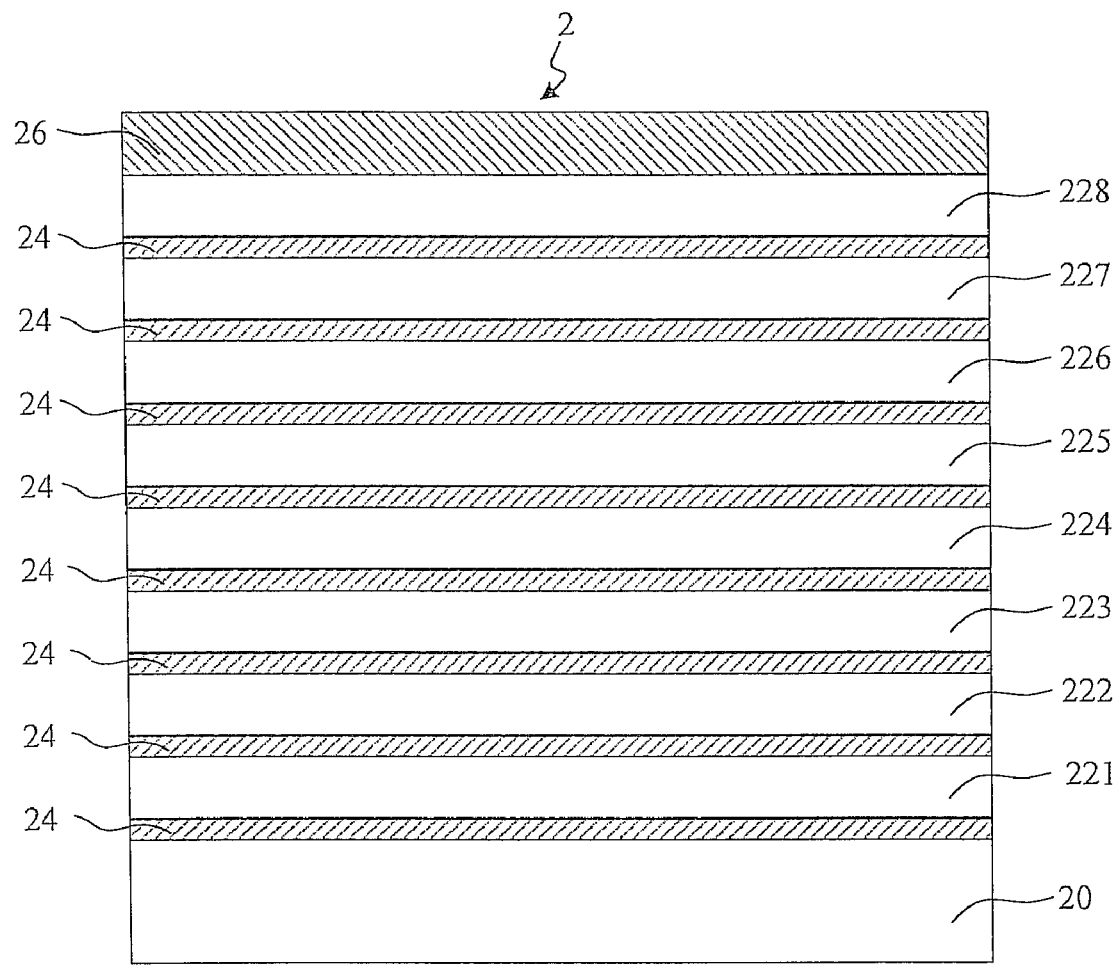

Please refer to FIG. 2A. FIG. 2A shows a simplified sectional view of an IC die (or a chip) 2 in a preferred embodiment according to the invention. As shown in FIG. 2A, the IC die 2 includes a semiconductor layer 20, eight successive metal layers (221~228) from bottom to top, several insulating layers 24 formed between two adjacent metal layers respectively, and a passivation layer 26. The semiconductor layer 20 is used for forming electronic components such as transistors (not shown in FIG. 2A). The number of the metal layers is determined by the complexity of the practical routing. Thus, the eight metal layers shown in FIG. 2A are provided only for the convenience of explanation, not as a limit to the invention.

Regarding the routing at the metal layers 221~228, a power distribution network (not shown in FIG. 2A) is formed at the first metal layer 221 and coupled to the electronic components. The power distribution network can include metal rails with a first line width. The metal rails are formed at the first metal layer 221 and coupled to the electronic components.

Figure 2B:
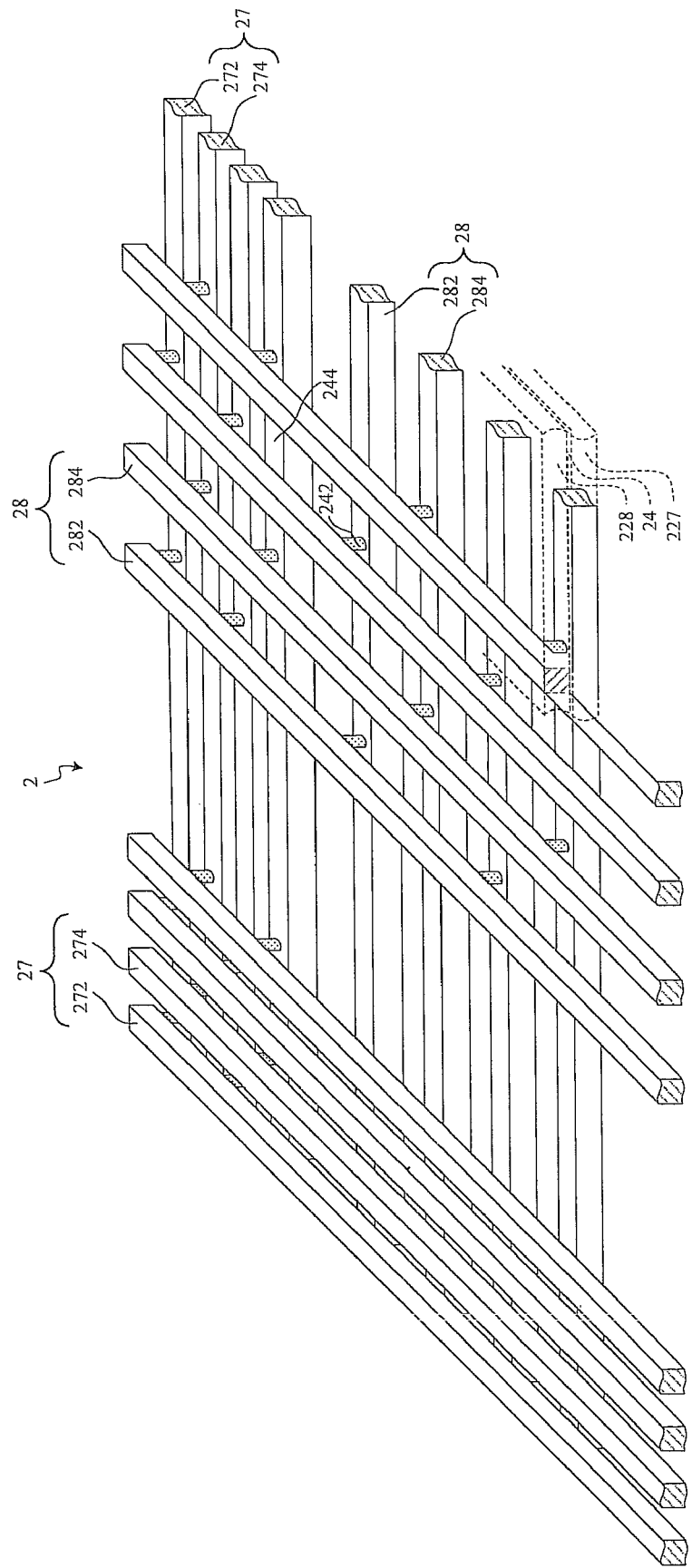

Please refer to FIG. 2B. FIG. 2B shows the higher metal layers and the routing formed thereon.

As shown in FIG. 2B, a power mesh 28 is formed among the Nth metal layer (the eighth metal layer 228 shown in FIG. 2B) to the ith metal layer (FIG. 2B only shows the seventh metal layer 227). In an embodiment, N is an integer larger than or equal to 6, i is an integer ranging from (N−3) to (N−1).

The power mesh 28 includes a plurality of metal trunks 282 and 284 with a second line width. And, the metal trunks 282 and 284 formed at different metal layers (e.g., the eighth metal layer 228 and the seventh metal layer 227 shown in FIG. 2B) are interconnected by a first via 242 formed at the insulating layer 24. In the same way, the power mesh 28 is connected to the power distribution network (not shown in FIG. 2B) by a second via (not shown in FIG. 2B) formed at the insulating layer 24. In practical applications, if eight metal layers are provided, the routing of the metal trunks will use the eighth and the seventh metal layers. For the complicated routing, even the sixth and the fifth metal layers are also used. If six metal layers are provided, the routing of the metal trunks generally uses the sixth metal layer and the fifth metal layers.

In fact, the second line width can be larger than or equal to the first line width. In an embodiment, the second line width is wider than the first line width. That is to say, in this embodiment, the line widths of the metal trunks 282 and 284 are wider than the line widths of the metal rails.

As also shown in FIG. 2B, the metal trunks 282 and 284 are divided into a power metal trunk 282 for connecting power and a ground metal trunk 284 for connecting ground. At the same metal layer, the power metal trunk 282 and the ground metal trunk 284 are interlaced. The metal trunks 282 and 284 formed at the adjacent metal layers (e.g., the eighth metal layer 228 and the seventh metal layer 227) are perpendicular to each other. The power metal trunks 282 formed at the adjacent metal layers (e.g., the eighth metal layer 228 and the seventh metal layer 227) are connected to each other, and the ground metal trunks 284 formed at the adjacent metal layers (e.g., the eighth metal layer 228 and the seventh metal layer 227) are also mutually connected.

Please refer to FIG. 2B again. A power supply ring 27 (a small section of the power supply ring 27 is shown in FIG. 2B) can be formed at the top metal layer 228. The power supply ring 27 can include metal rings 272 and 274 with the second line width. That is to say, in an embodiment of the invention, the line widths of the metal rings 272 and 274 are the same with the line widths of the metal trunks 282 and 284. In the invention, the required structure of the metal rings 272 and 274 is formed by adjusting the wiring density of the metal trunks 282 and 284. The power supply ring 27 formed by defining the metal trunks 282 and 284 is capable of receiving a power and conducting the power to the power distribution network through the power mesh 28. The power distribution network can be further used for distributing the power to the electronic components.

According to the routing technologies of the invention, the impedance difference between the power mesh 28 and the power supply ring 27 is reduced, and overheating of the metal routing is prevented. In addition, in order to ease off the routing congestion of the power mesh 28 and the power supply ring 27, the metal rings 272 and 274 can also be formed among the (N−1)th metal layer to the ith metal layer in another preferred embodiment of the invention as shown in FIG. 2B.

According the characteristic, spirit, and advantage of the invention, the invention also discloses a method 3 for designing an IC die (or a chip). Substantially, the IC die includes a semiconductor layer and N successive metal layers from bottom to top, wherein N can be a positive integer larger than or equal to 6. Each of the metal layers is isolated and formed over the semiconductor layer. The following will describe in detail the steps of the method 3 for designing an IC die according to the invention.

Figure 3:
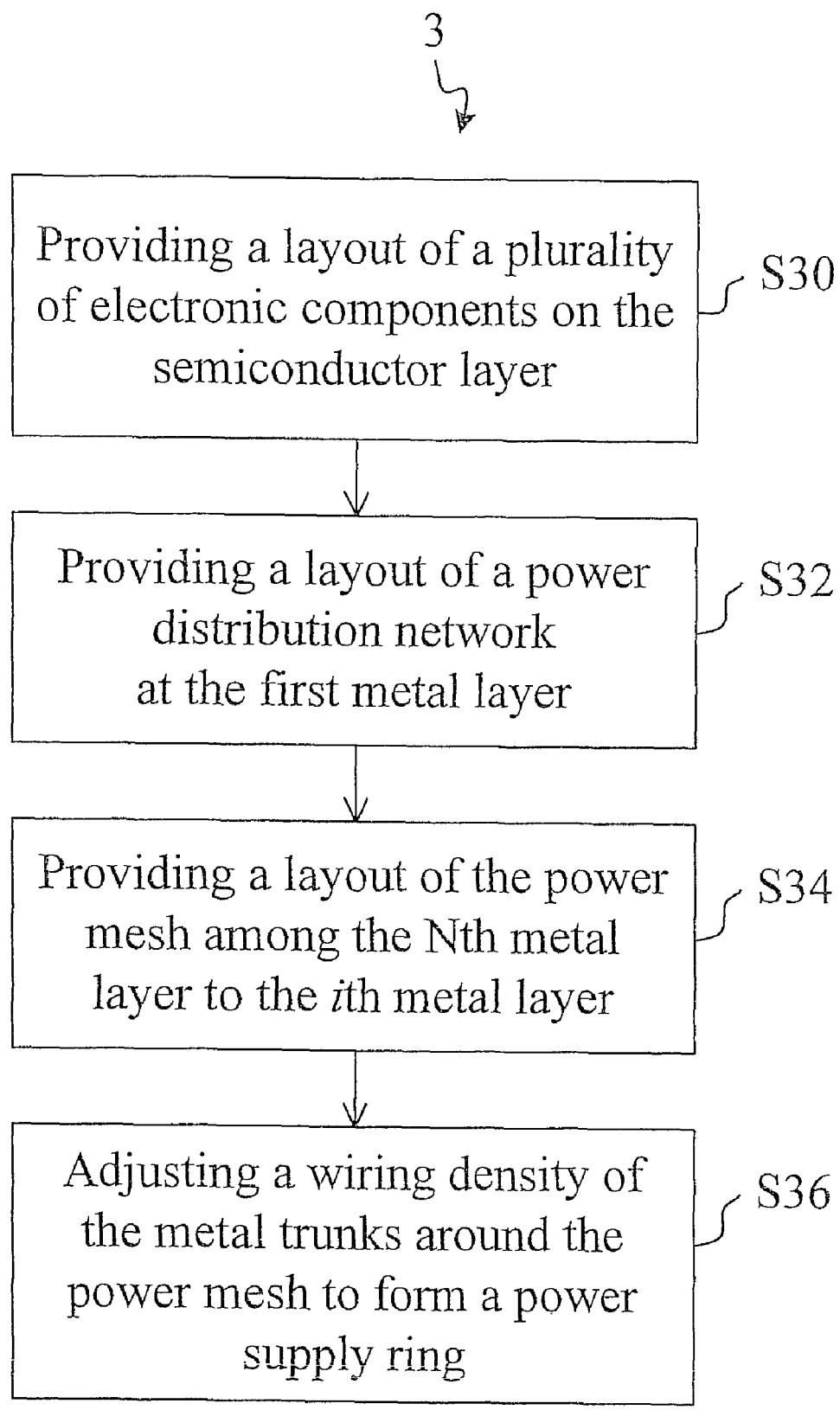
FIG. 3 is a flow diagram of the method for designing IC die according to the invention.

Please refer to FIG. 3. Firstly, the designing method 3 performs step S30 to provide a layout of electronic components on the semiconductor layer.

Then, the designing method 3 performs step S32 to provide a layout of a power distribution network at the first metal layer. The power distribution network includes metal rails and is coupled to the electronic components.

Next, the designing method 3 performs step S34 to provide a layout of the power mesh among the Nth metal layer to the ith metal layer. i is an integer ranging from (N−3) to (N−1). The power mesh can include metal trunks with a second line width, and the second line width can be set wider than or equal to the first line width. The metal trunks are mutually interconnected by a plurality of first vias and further connected to the metal rails by a plurality of second vias.

At last, the designing method 3 performs step S36 to adjust a wiring density of the metal trunks around the power mesh to form a power supply ring. The power supply ring includes a plurality of metal rings, the power supply ring receives a power and conducts the power to the power distribution network through the power mesh. The power supply ring can further distribute the power to the electronic components.

In order to ease off the routing congestion of the power mesh and the power supply ring, the designing method 3 can further provide a layout of the metal rings among the (N−1)th metal layer to the ith metal layer.

In an embodiment according to the invention, because the needed power supply rings can be generated by using the metal routing with the same line width, the needed power supply rings will be formed by adjusting the wiring density of the metal routing in a computer-automatized way after a user definition. In this way, it is not necessary to spend extra human resource for the routing in different circuit layouts.

Figure 4:
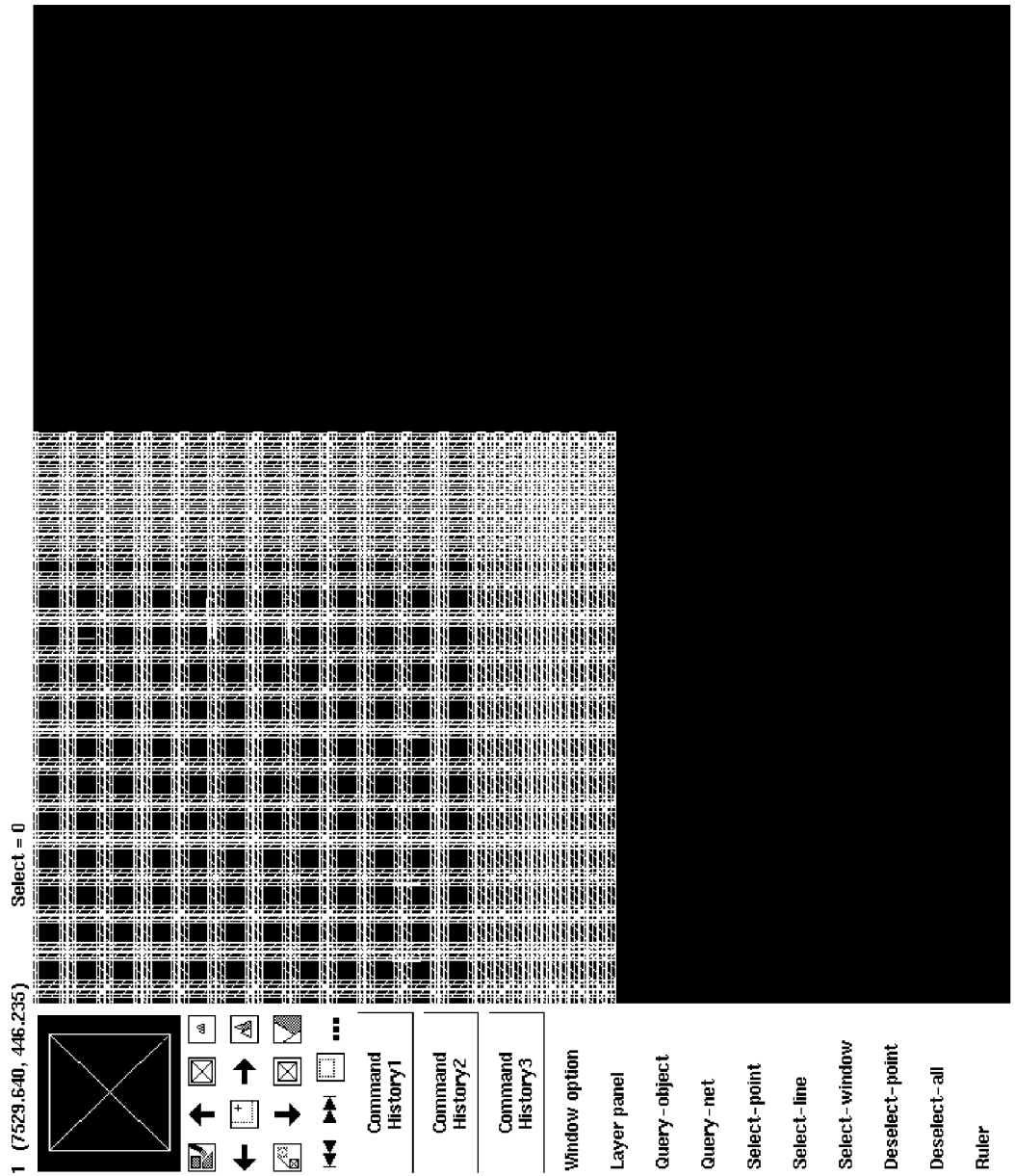
FIG. 4 is a practical design diagram case of a part of the generated power supply ring after adjusting the wiring density of the metal routing according to the invention.
Figure 5:
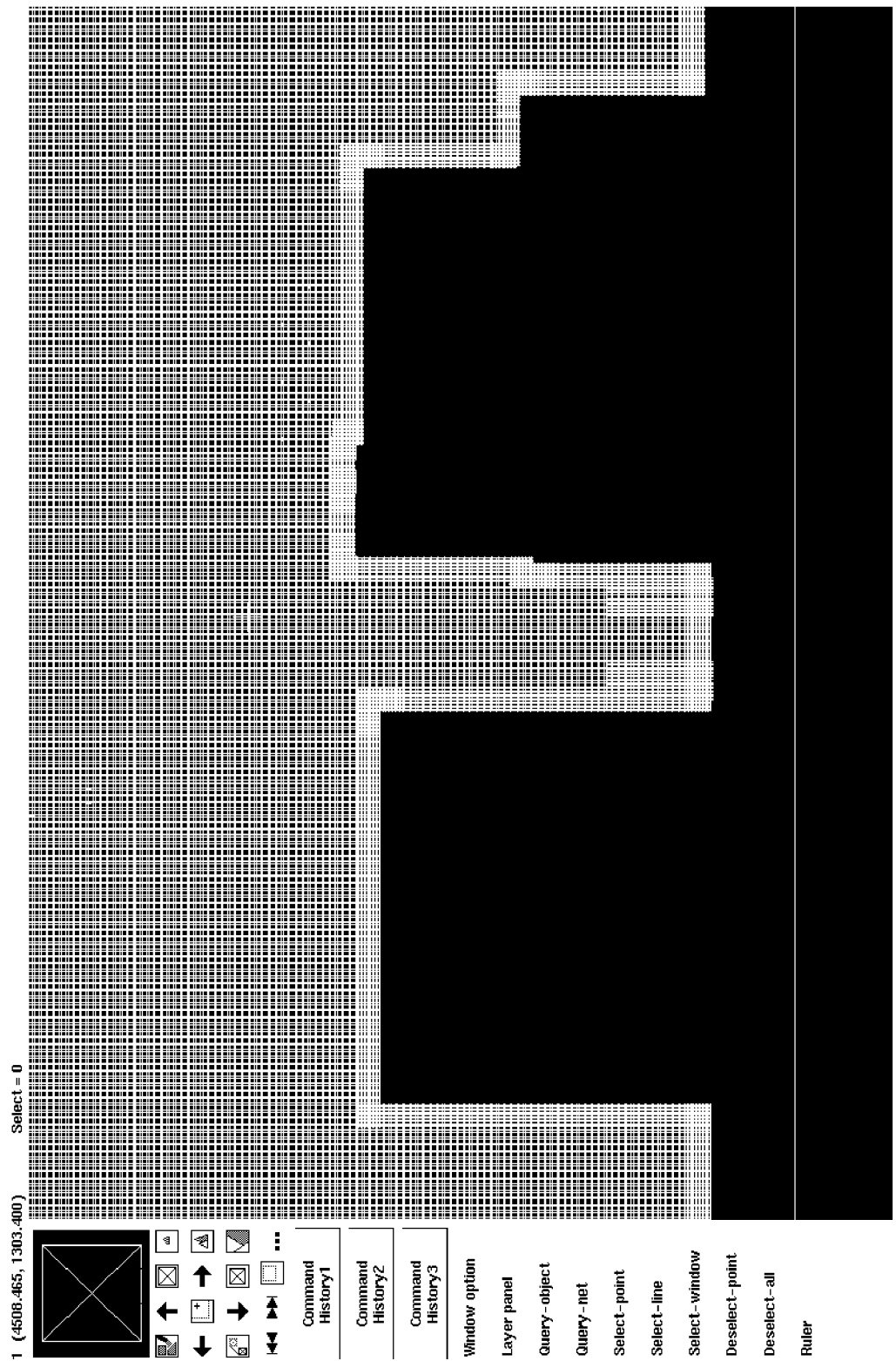
FIG. 5 is a practical design diagram case of the power supply ring (edge automatic routing) formed by computer automation according to the invention.

Please refer to FIG. 4 and FIG. 5. FIG. 4 is a practical design diagram of a part of the generated power supply ring after adjusting the wiring density of the metal routing. FIG. 5 is a practical design diagram of the power supply ring (edge automatic routing) formed by computer automation corresponding to the different circuit layouts.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A power layout of an integrated circuit, comprising:
   a semiconductor layer;
   a plurality of electronic components, formed on the semiconductor layer;
   N successive metal layers from bottom to top, isolated from each other and formed over the semiconductor layer, N being a positive integer, and Nth metal layer being the top metal layer;
   a power distribution network comprising a plurality of metal rails and being coupled to the electronic components, the power distribution network being formed from among (i−1)th metal layer to the bottom metal layer;
   a power mesh comprising a plurality of metal trunks, the metal trunks being formed among the Nth metal layer to ith metal layer, the metal trunks being mutually interconnected by a plurality of first vias, and being connected to the metal rails by a plurality of second vias, i being a positive integer smaller than N; and
   a power supply ring comprising a plurality of metal rings, the metal rings being formed by parts of the metal trunks that are densely concentrated, the power supply ring receiving a power and conducting the power to the power distribution network through the power mesh and further distributing the power to the electronic components, wherein a metal ring forming the power supply ring has a same line width as a metal trunk forming the power mesh.

2. The power layout of claim 1, wherein N is larger than or equal to 6.

3. The power layout of claim 1, wherein the metal rails have a first line width, the metal trunks have a second line width, and the second line width is larger than or equal to the first line width.

4. The power layout of claim 1, wherein the metal rails are formed at the first metal layer.

5. The power layout of claim 1, wherein i ranges from (N−3) to (N−1).

6. The power layout of claim 5, wherein the metal rings are formed among the Nth metal layer to the ith metal layer.

7. The power layout of claim 5, wherein the metal trunks at jth metal layer are perpendicular to the metal trunks at (j−1)th metal layer, j is a positive integer ranging from (i+1) to N.

8. The power layout of claim 1, wherein the power ring surrounds the power mesh.

* * * * *